(12) United States Patent
Hiramatsu

(10) Patent No.: US 7,241,984 B2
(45) Date of Patent: Jul. 10, 2007

(54) IMAGING APPARATUS USING SATURATION SIGNAL AND PHOTOELECTRIC CONVERSION SIGNAL TO FORM IMAGE

(75) Inventor: Makoto Hiramatsu, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 11/347,738

(22) Filed: Feb. 2, 2006

(65) Prior Publication Data

US 2006/0175537 A1 Aug. 10, 2006

(30) Foreign Application Priority Data

Feb. 10, 2005 (JP) ............... 2005-034586

(51) Int. Cl.
*H01L 27/00* (2006.01)
(52) U.S. Cl. ............... 250/208.1; 250/214 R; 250/214 C; 348/302; 348/308
(58) Field of Classification Search ............. 250/208.1, 250/214 R, 214 C; 348/300–308
See application file for complete search history.

(56) References Cited

U.S. PATENT DOCUMENTS 6,548,798 B2 * 4/2003 Yoneda et al. ........... 250/208.1

7,034,957 B2 * 4/2006 Yang et al. ................... 358/1.2
2004/0189837 A1 * 9/2004 Kido ........................ 348/241
2006/0221221 A1 * 10/2006 Furukawa et al. .......... 348/302

FOREIGN PATENT DOCUMENTS

| JP | 2002-252794 A | 9/2002 |
| JP | 2004335802 A * | 11/2004 |
| WO | WO 2004112382 A1 * | 12/2004 |

\* cited by examiner

*Primary Examiner*—Thanh X. Luu
*Assistant Examiner*—Stephen Yam

(57) ABSTRACT

At least one exemplary embodiment is directed to an imaging apparatus which can include a plurality of pixel sections disposed in a two-dimensional pattern. Each pixel section can include a photoelectric conversion member, a semiconductor region holding a signal transferred from the photoelectric conversion member, a transfer switch transferring the signal of the photoelectric conversion member to the semiconductor region, and a reading member reading a signal of the semiconductor region. A plurality of vertical output lines, successively output signals of the pixel sections. At least one horizontal output line successively outputs signals of the plurality of vertical output lines.

7 Claims, 21 Drawing Sheets

IMAGING APPARATUS USING SATURATION SIGNAL AND PHOTOELECTRIC CONVERSION SIGNAL TO FORM IMAGE

BACKGROUND OF THE INVENTION

1 Field of the Invention

The present invention relates to an imaging apparatus, and more particularly, though not exclusively, to an imaging apparatus that picks up an image of a photographed object.

2. Description of the Related Art

Conventional imaging apparatuses, including digital cameras, use a CMOS sensor or a CCD as an imaging element. Especially in recent years, due to the demand for high performance digital cameras, the need for imaging elements having an increased number of pixels has increased.

FIG. 21 is a block diagram showing a conventional imaging apparatus.

A sensor 90 is driven by a timing generating apparatus (hereinafter, referred to as TG) 91. An AD converter 92 converts an output of the sensor 90 into a digital signal. The digital signal, as an image output, is entered into an image processing section 93. The image processing section 93 performs image processing and produces an image.

The sensors practically used for the imaging apparatuses are, for example, CMOS sensors and CCDs.

FIG. 15 shows a detailed arrangement of a conventional CMOS sensor.

A photodiode (hereinafter, referred to as PD) 51 is connected via a transfer switch 52 to a floating diffusion region (hereinafter, referred to as FD) 53. FD 53 is connected via a reset switch 54 to a reset voltage terminal 55. FD 53 is a gate of a field-effect transistor (hereinafter, referred to as FET) 56. A drain of FET 56 is connected to a predetermined voltage terminal. A source of FET 56 is connected via a selection switch 57 to a vertical output line 58. The above arrangement, minus the vertical output line 58, constitutes a pixel section 59. A plurality of pixel sections, disposed along the vertical output line 58, cooperatively form a column 60. Numerous columns cooperatively constitute the area sensor 90.

At least one constant-current source 61 is connected to each vertical output line 58. Electric charge in the floating diffusion region of a selected pixel section determines the voltage of the vertical output line 58. Furthermore, a capacitor 62 is connected via a changeover switch 63 to the vertical output line 58. The capacitor 62 functions as a memory that temporarily stores an output of the pixel section 59. Similarly, a capacitor 64 is connected via a changeover switch 65 to the vertical output line 58. The capacitor 64 functions as a memory that temporarily stores a reset level voltage.

The capacitor 62 is connected via the changeover switch 63 to a horizontal output line 66. The capacitor 64 is connected via the changeover switch 65 to a horizontal output line 67. The horizontal output lines 66 and 67 are connected to a differential amplifier 68. The differential amplifier 68 subtracts the reset level voltage stored in the capacitor 64 from the output voltage of the pixel section 59 stored in the capacitor 62. Thus, the differential amplifier 68 produces an image output.

FIG. 16 illustrates timing pulses produced from TG 91. TG 91 operates in the following manner. When a pixel section 59 is selected, a selection pulse becomes "High. The selection switch 57 is turned on.

In this case, a reset pulse is "High. The reset switch 54 is in the ON state. FD 53 is reset to a predetermined voltage. In this condition, a reset level voltage, i.e., a voltage obtained when FD 53 is maintained at a predetermined voltage, is output to the vertical output line 58. Subsequently, a memory pulse 1 becomes "High" and accordingly the changeover switch 65 shifts its movable contact to the vertical output line 58. The capacitor 64 stores the reset level voltage. Next, a transfer pulse becomes "High" and accordingly the transfer switch 52 is turned on. Electric charge of the pixel section 59 is passed (read out) from PD 51 to FD 53.

As FD 53 holds the transferred electric charge of the pixel section 59, FET 56 converts the electric charge into a voltage. The converted voltage is output to the vertical output line 58 as a voltage corresponding to the electric charge of pixel section 59. In this condition, a memory pulse 2 becomes "High" and accordingly the changeover switch 63 shifts its movable contact to the vertical output line 58. Thus, the capacitor 62 temporarily stores the voltage corresponding to the electric charge of pixel section 59.

Then, a read pulse becomes "High" to connect the changeover switches 63 and 65 to the horizontal output lines 66 and 67, respectively. The reset level voltage temporarily stored in the capacitor 64 is output to the horizontal output line 67. The voltage corresponding to the electric charge of pixel section 59 temporarily stored in the capacitor 62 is output to the horizontal output line 66. The differential amplifier 68 produces an output representing the output of the pixel section 59.

In the arrangement of FIG. 15, the capacitor 64, the changeover switch 65, and the horizontal output line 67 are the components used to remove the reset level voltage. However, these components can be omitted when the output of the pixel section 59 is directly taken out.

Furthermore, to improve signal quality of the CMOS sensor, FIG. 17 illustrates an arrangement for the CMOS sensor.

The pixel section shown in FIG. 17 is identical in arrangement with the above-described pixel section shown in FIG. 15, and accordingly will not be described in the following.

Furthermore, the vertical output line 58 and the constant-current source 61 are identical with those disclosed in the FIG. 15, and accordingly will not be described in the following.

A capacitor 70 is connected, at one end, to the vertical output line 58. The capacitor 70 temporarily stores the reset level voltage of FD 53. The other end of the capacitor 70 is connected to a positive input terminal of a differential amplifier 73. Furthermore, the other end of the capacitor 70 is connected to a switch 72 that is used for virtually grounding the differential amplifier 73, and is also connected to a capacitor 71 that temporarily stores a difference between the reset level voltage and a signal level voltage.

An output terminal of the differential amplifier 73 is connected via the changeover switch 63 to the capacitor 62 that functions as a memory temporarily storing the output of pixel section 59. Furthermore, the capacitor 62 is connected via the changeover switch 63 to the horizontal output line 66. Thus, the output of pixel section 59 can be read out of the capacitor 62 via an output amplifier 74 connected to the horizontal output line 66.

FIG. 18 shows timing pulses produced from TG 91. TG 91 operates in the following manner.

When a pixel section 59 is selected, a selection pulse becomes "High" and accordingly the selection switch 57 is turned on.

In this case, a reset pulse is "High. The reset switch 54 is in the ON state. FD 53 is reset to a predetermined voltage. In this condition, the reset level voltage, i.e., a voltage obtained when FD 53 is maintained at a predetermined voltage, is output to the vertical output line 58. Furthermore, a differential pulse is "High" in this condition. The switch 72 is closed and the reset level voltage is stored in the capacitor 70.

Then, the differential pulse turns into "Low. The switch 72 is opened, while the transfer pulse becomes "High. Accordingly, the transfer switch 52 is turned on. Electric charge of the pixel section 59 is passed (read out) from PD 51 to FD 53. As FD 53 holds the transferred electric charge of the pixel section 59, FET 56 converts the electric charge into a voltage. The converted voltage is output to the vertical output line 58 as a voltage corresponding to the electric charge of pixel section 59.

The capacitor 71 stores a difference voltage between the previous reset level voltage and the voltage corresponding to the electric charge of pixel section 59. The differential amplifier 73 produces an output voltage representing the difference. In this condition, a memory pulse becomes "High" and accordingly the changeover switch 63 shifts its movable contact to the vertical output line 58. Thus, the capacitor 62 temporarily stores the voltage corresponding to the electric charge of pixel section 59.

Then, a read pulse becomes "High" to connect the changeover switch 63 to the horizontal output line 66. The voltage corresponding to the electric charge of pixel section 59 temporarily stored in the capacitor 62 is output to the horizontal output line 66. The output amplifier 74 produces an output representing the output of the pixel section 59 (refer to Japanese Patent Application Laid-open No. 2002-252794).

An imaging element can be constructed from a CCD.

FIG. 19 illustrates a practical CCD arrangement.

PD 81 is connected via a transfer gate 82 to a vertical CCD 83. The vertical transfer CCDs can include a final stage CCD connected to a horizontal CCD 84. The horizontal transfer CCDs (e.g., including horizontal CCD 84) can include a final stage CCD connected to an output amplifier 85. The output amplifier 85 produces an image output.

FIG. 20 illustrates timing pulses produced from TG 91. TG 91 operates in the following manner.

When a transfer pulse becomes "High", a photoelectron of PD 81 is transferred to a first stage of the vertical CCD 83.

The photoelectron transferred to the first stage of the vertical CCD 83 is successively transferred to succeeding stages of the vertical transfer CCDs in response to a V transfer pulse. Every time, the photoelectron is transferred by one step in the vertical transfer CCDs to the next, the photoelectron of the final stage of vertical transfer CCDs is transferred to a first stage of horizontal transfer CCDs (e.g., horizontal CCD 84). The photoelectron transferred to the first stage of the horizontal transfer CCDs is successively transferred to succeeding stages of the horizontal transfer CCDs in response to an H transfer pulse.

Every time, the photoelectron is transferred by one step in the horizontal transfer CCDs to the next, the photoelectron of the final stage of horizontal transfer CCDs is output to the output amplifier 85. The output amplifier 85 produces an image output.

However, according to the above-described conventional arrangement, the dynamic range of an imaging element is substantially dependent on the size of pixel sections. Thus, the conventional arrangement cannot increase the number of pixel sections in an imaging element.

Several years ago, the number of pixel sections constituting an imaging element was in a range from one million to two millions. However, the present imaging elements generally include five to six millions of pixel sections. Some of advanced imaging elements include tens of millions of pixel sections.

Digital cameras are very compact. Increasing the body size of an incorporated imaging element is substantially difficult and the pixel sections are decreased to a half size or less compared with those of several years ago. Accordingly, securing a satisfactory dynamic range for a sensor is difficult.

SUMMARY OF THE INVENTION

At least one exemplary embodiment is directed to an imaging apparatus configured to form an image having a wider dynamic range.

At least one exemplary embodiment is directed to an imaging apparatus including a plurality of pixel sections disposed in a two-dimensional pattern, a plurality of vertical output lines, at least one horizontal output line, a driving circuit, and a signal processing circuit. Each pixel section can include a photoelectric conversion member, a semiconductor region holding a signal transferred from the photoelectric conversion member, a transfer switch transferring the signal of the photoelectric conversion member to the semiconductor region, and a reading member reading a signal of the semiconductor region. Each vertical output line, provided for a plurality of pixel sections disposed in a vertical direction, successively outputs signals of the pixel sections. The horizontal output line successively outputs signals from the vertical output lines.

The driving circuit drives the reading member to successively read a saturation signal leaked from the photoelectric conversion member to the semiconductor region, during a charging period of photoelectric charge in the photoelectric conversion member. Furthermore, the driving circuit drives the reading member to read a photoelectric conversion signal generated from the photoelectric conversion member. Both the saturation signal and the photoelectric conversion signal can be read out via the same path of the vertical output line and the horizontal output line. Additionally, the signal processing circuit can form an image based on the saturation signal and the photoelectric conversion signal.

At least one further exemplary embodiment is directed to an imaging apparatus including a plurality of pixel sections disposed in a two-dimensional pattern, a driving circuit, a correction circuit, and a signal processing circuit. Each pixel section can include a photoelectric conversion member, a semiconductor region holding a signal transferred from the photoelectric conversion member, a transfer switch transferring the signal of the photoelectric conversion member to the semiconductor region, and a reading member reading the signal of the semiconductor region.

The driving circuit can drive the reading member to successively read a saturation signal leaked from the photoelectric conversion member to the semiconductor region, during a charging period of photoelectric charge in the photoelectric conversion member. Furthermore, the driving circuit can drive the reading member to read a photoelectric conversion signal generated from the photoelectric conversion member. The correction circuit can reduce errors in the saturation signal (herein also referred to as correcting the saturation signal), for example to produce a saturation signal with reduced errors (herein also referred to as a corrected saturation signal). And, the signal processing circuit forms an image based on the corrected saturation signal and the photoelectric conversion signal.

At least one further exemplary embodiment is directed to an imaging apparatus including a plurality of pixel sections disposed in a two-dimensional pattern, a driving circuit, a differential processing circuit, and a signal processing circuit. Each pixel section can include a photoelectric conversion member, a semiconductor region holding a signal transferred from the photoelectric conversion member, a transfer switch transferring the signal of the photoelectric conversion member to the semiconductor region, and a reading member reading a signal of the semiconductor region.

The driving circuit can drive the reading member to read a first reset signal obtained after the semiconductor region of the pixel section of a first line is reset, then drives the reading member to read a saturation signal generated in the pixel section of a second line, then can drive the reading member to read a second reset signal obtained after the semiconductor region of the pixel section of the second line is reset, and then drives the reading member to read a photoelectric conversion signal generated from the pixel section of the second line. The differential processing circuit executes differential processing between the first reset signal and the saturation signal, and differential processing between the second reset signal and the photoelectric conversion signal.

And, the signal processing circuit forms an image based the saturation signal and the photoelectric conversion signal that are both subjected to the differential processing. The saturation signal is a signal leaked from the photoelectric conversion member to the semiconductor region during a charging period of photoelectric charge in the photoelectric conversion member.

At least one further exemplary embodiment is directed to an imaging apparatus including a plurality of pixel sections disposed in a two-dimensional pattern, a driving circuit, and a signal processing circuit. Each pixel section can include a photoelectric conversion member, a semiconductor region holding a signal transferred from the photoelectric conversion member, a transfer switch transferring the signal of the photoelectric conversion member to the semiconductor region, and a reading member reading a signal of the semiconductor region.

The driving circuit can drive the reading member, in each of the pixel sections disposed in the two-dimensional pattern, to successively read a saturation signal leaked from the photoelectric conversion member to the semiconductor region, during a charging period of photoelectric charge in the photoelectric conversion member. Then, the driving circuit can drive the reading member, in each of the pixel sections disposed in the two-dimensional pattern, to successively read a photoelectric conversion signal generated from the photoelectric conversion member. And, the signal processing circuit forms an image based on the saturation signal and the photoelectric conversion signal.

Further features will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention.

DETAILED DESCRIPTION OF THE EMBODIMENTS

Figure 1:
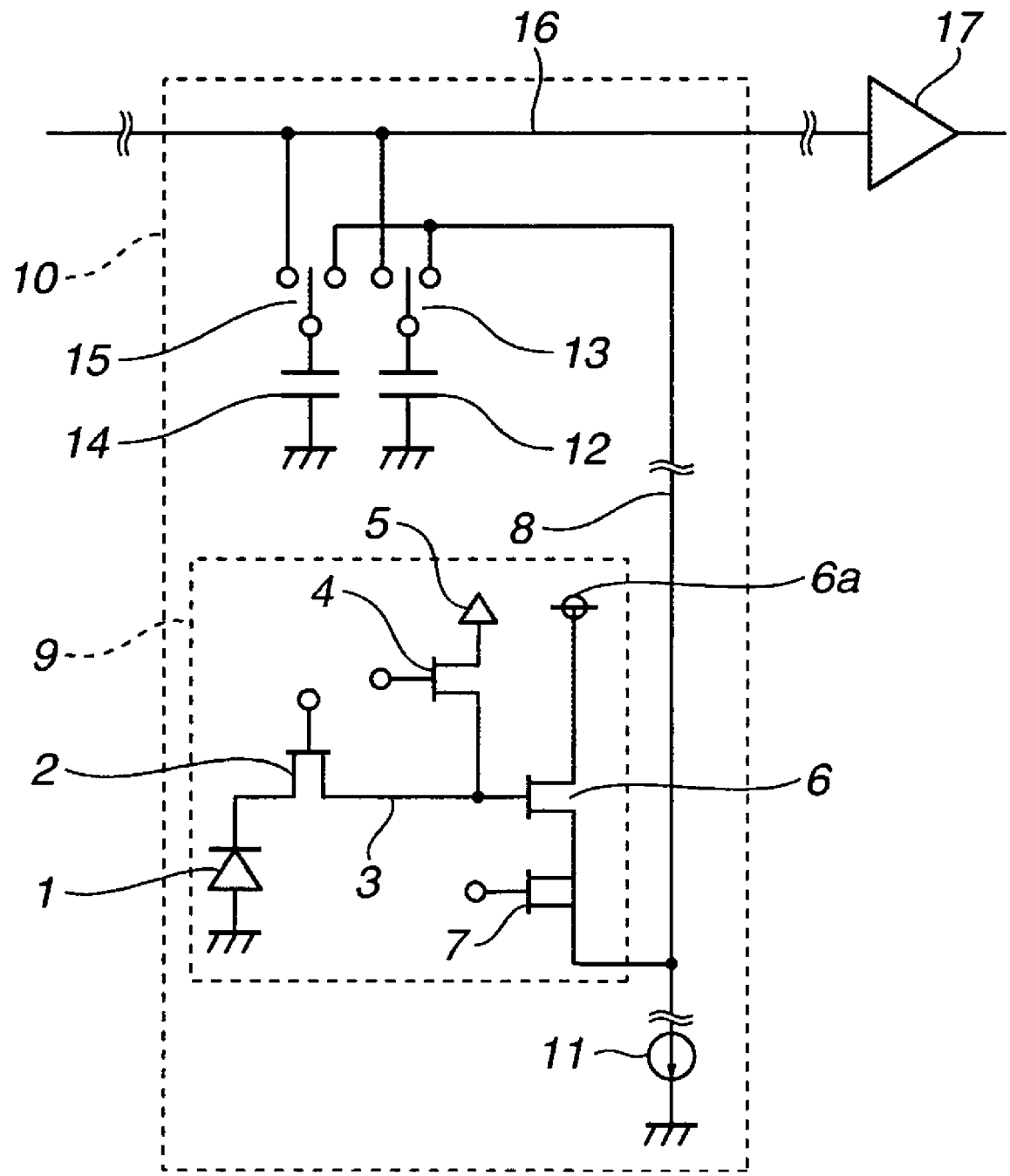
FIG. 1 is a circuit diagram showing an imaging element in accordance with a first exemplary embodiment.

The following description of exemplary embodiment(s) is/are merely illustrative in nature and is in no way intended to limit the invention, its application, or uses.

Processes, techniques, apparatus, and materials as known by one of ordinary skill in the art may not be discussed in detail but are intended to be part of the enabling description where appropriate. For example, certain circuitry for signal processing, displaying, and others may not be discussed in detail. However these systems and the methods to fabricate these system as known by one of ordinary skill in the relevant art is intended to be part of the enabling disclosure herein where appropriate.

Note that similar reference numerals and letters refer to similar items in the following figures, and thus once an item is defined in one figure, it may not be discussed for following figures.

Exemplary embodiments will be described in detail below with reference to the drawings.

First Exemplary Embodiment

A first exemplary embodiment will be described with reference to the following drawings.

FIG. 1 is a circuit diagram showing a CMOS sensor, functioning as an imaging element in an imaging apparatus, in accordance with a first exemplary embodiment.

A photodiode (hereinafter, referred to as PD) 1 is connected via a transfer switch 2 to a floating diffusion region (hereinafter, referred to as FD) 3 being a semiconductor region. FD 3 is connected via a reset switch 4 to a reset voltage terminal 5. FD 3 can be agate of a field-effect transistor (hereinafter, referred to as FET) 6. A drain of FET 6 is connected to a predetermined voltage terminal 6*a*. A source of FET 6 is connected via a selection switch 7 to a vertical output line 8. The above arrangement constitutes a pixel section 9. A plurality of pixel sections, disposed along the vertical output line 8, cooperatively form a column 10. Numerous columns cooperatively constitute an area sensor 20.

At least one constant-current source 11 is connected to each vertical output line 8. Electric charge in the floating diffusion region of a selected pixel section determines the voltage of the vertical output line 8. Furthermore, a capacitor 12 is connected via a changeover switch 13 to the vertical output line 8. The capacitor 12 functions as a memory that temporarily stores an output of the pixel section 9 (i.e., an output obtained when electric charge of PD 1 is transferred to FD 3 in response to opening of the transfer switch 2). A capacitor 14 is connected via a changeover switch 15. The capacitor 14 functions as a memory that temporarily stores a saturation output. The capacitors 12 and 14 are connected via the changeover switches 13 and 15 to a single horizontal output line 16. An output amplifier 17 connected to the horizontal output line 16 produces an image output.

Figure 2:
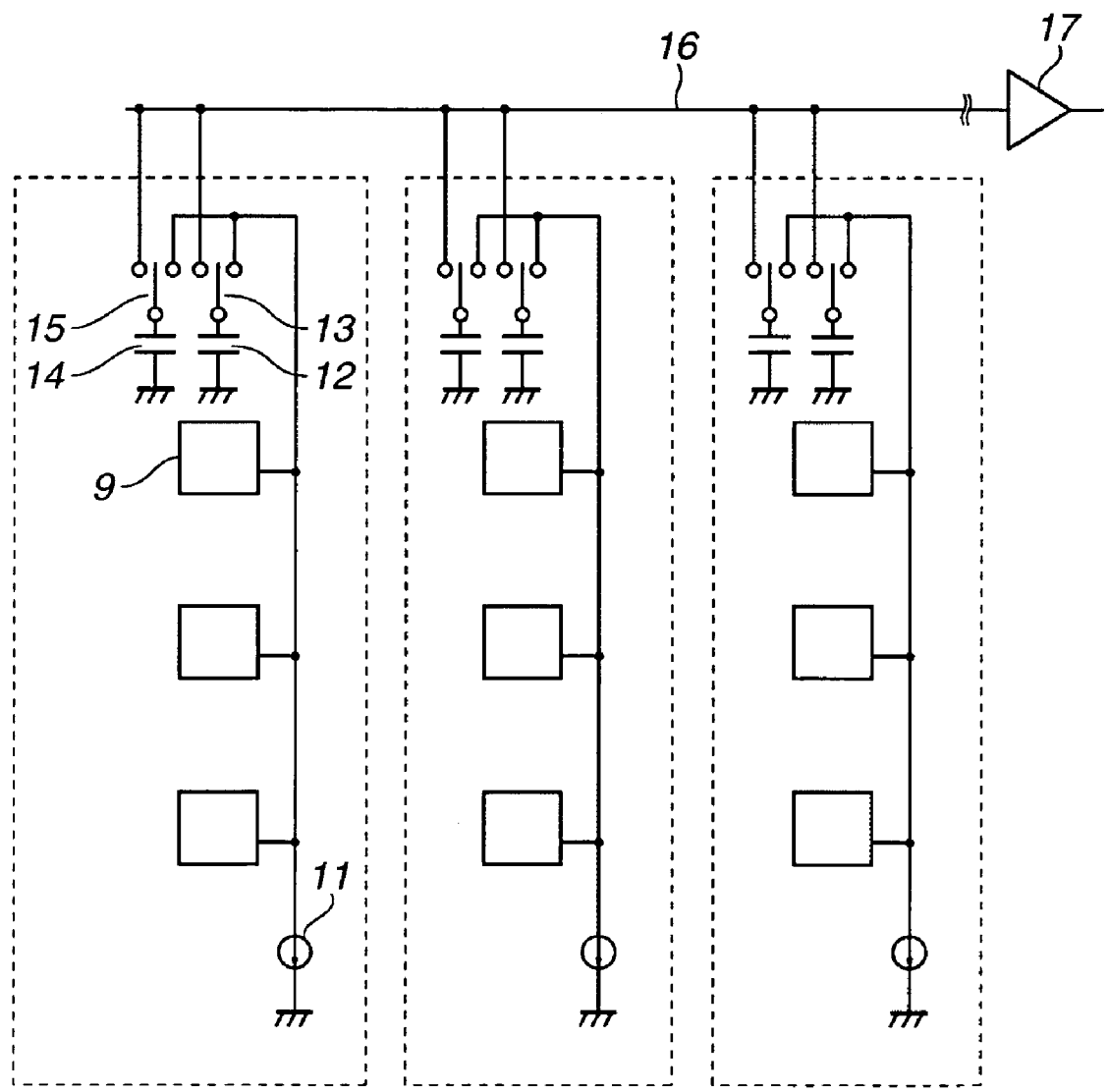
FIG. 2 is a circuit diagram showing the imaging element in accordance with the first exemplary embodiment.

Although FIG. 1 shows only one pixel section, an actual arrangement can include numerous pixel sections 9 disposed in a two-dimensional pattern as shown in FIG. 2. In FIG. 2, each rectangular portion encircled by a dotted line has the same circuit arrangement.

Figure 3:
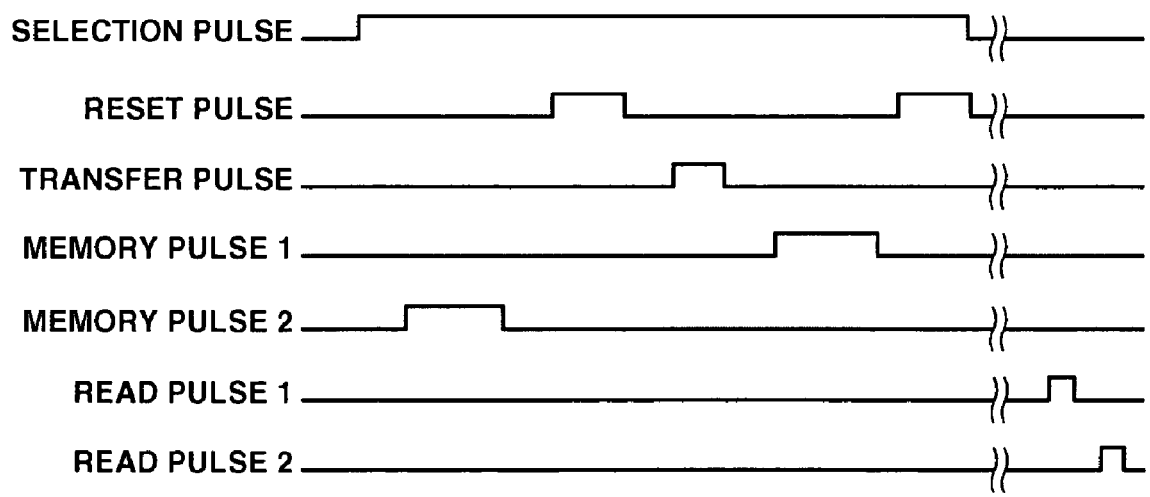
FIG. 3 is a timing chart showing a sensor driving operation in accordance with the first exemplary embodiment.

FIG. 3 shows timing pulses produced from TG (timing generator). TG operates in the following manner. When a pixel section 9 is selected, a selection pulse becomes "High." The selection switch 7 is turned on.

In this condition, when PD 1 is in a saturated state, saturation charge flows into FD 3. FD 3 has electric charge corresponding to a saturated light quantity. FET 6 converts the electric charge into a voltage. A voltage corresponding to the saturated light quantity is output to the vertical output line 8. In this condition, a memory pulse 2 becomes "High." A changeover switch 15 shifts its movable contact to the vertical output line 8. A capacitor 14 temporarily stores a voltage corresponding to the saturated light quantity.

Then, a reset pulse becomes "High." The reset switch 4 then becomes set to an ON state. FD 3 is reset to a predetermined voltage. Then, a transfer pulse becomes "High." The transfer switch 2 is turned on. Electric charge of the pixel section 9 is passed (read out) from PD 1 to FD 3. In this condition, FD 3 holds the transferred electric charge of pixel section 9. Accordingly, FET 6 converts the electric charge into a voltage. A voltage corresponding to the electric charge of pixel section 9 is output to the vertical output line 8. In this condition, a memory pulse 1 becomes "High." The changeover switch 13 shifts its movable contact to the vertical output line 8. The capacitor 12 temporarily stores a voltage corresponding to the electric charge of pixel section 9.

Then, a read pulse 1 becomes "High." The changeover switch 13 shifts its movable contact to the horizontal output line 16. The voltage corresponding to the electric charge of pixel section 9 temporarily stored in the capacitor 12 is output to the horizontal output line 16. The output amplifier 17 produces an output representing the output of pixel section 9. Then, a read pulse 2 becomes "High." The changeover switch 15 shifts its movable contact to the horizontal output line 16. The voltage corresponding to the saturated light quantity. temporarily stored in the capacitor 14 is output to the horizontal output line 16. The output amplifier 17 produces an output representing a saturation output (i.e., the voltage corresponding to the saturated light quantity).

Figure 4:
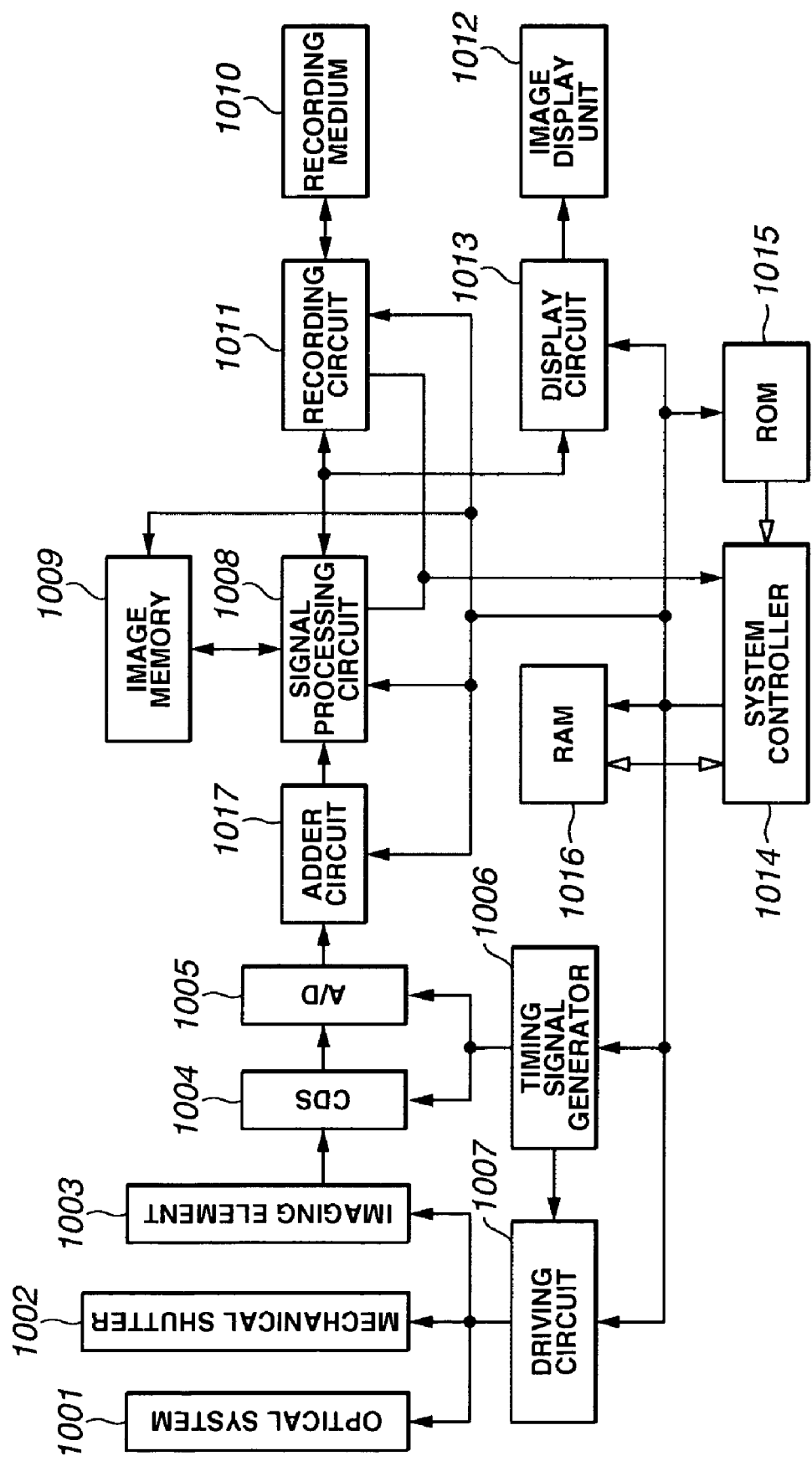
FIG. 4 is a block diagram showing an entire arrangement of an imaging apparatus in accordance with at least one exemplary embodiment.

FIG. 4 is a block diagram showing an imaging apparatus including the above-described imaging element.

The imaging apparatus shown in FIG. 4 can include an optical system 1001, a mechanical shutter 1002, an imaging element 1003, a CDS circuit 1004, an AD converter 1005 (A/D), a timing signal generator (TG) 1006, a driving circuit 1007, a signal processing circuit 1008, an image memory 1009, an image recording medium 1010, a recording circuit 1011, an image display unit 1012, a display circuit 1013, a system controller 1014, a nonvolatile memory (e.g., ROM) 1015, a volatile memory (e.g., RAM), and an adder circuit 1017.

The optical system 1001 can include a predetermined combination of lenses and diaphragm. The CDS circuit 1004 processes an analog signal. AD converter 1005 converts the analog signal from the CDS circuit 1004 into a digital signal. TG 1006 generates timing signals for the imaging element 1003, the CDS circuit 1004, and the AD converter 1005 (i.e., timing pulses shown in FIGS. 3, 7, 9, 10, 11, 12, 13, and 16). The driving circuit 1007 drives each of the optical system 1001, the mechanical shutter 1002, and the imaging element 1003. The adder circuit 1017 applies adding processing to image data for the purpose of a later-described expansion of the dynamic range.

After the adding processing for the image data is finished, the signal processing circuit 1008 executes signal processing for the image data. After the signal processing for the image data is finished, the image memory 1009 stores the image data. The image recording medium 1010 can be detachable from the imaging apparatus. After the signal processing for the image data is finished, the recording circuit 1011 records the image data into the image recording medium 1010.

The image display unit 1012 displays the processed image data. The display circuit 1013 controls the image display unit 1012 to display the image. The system controller 1014 controls the imaging apparatus. ROM 1015 stores various control programs for the system controller 1014 as well as related control data including parameters and tables. RAM 1016 temporarily stores programs, control data, and correction data transferred from ROM 1015, so that the system controller 1014 can use the programs and the data to control the imaging apparatus.

Figure 5:
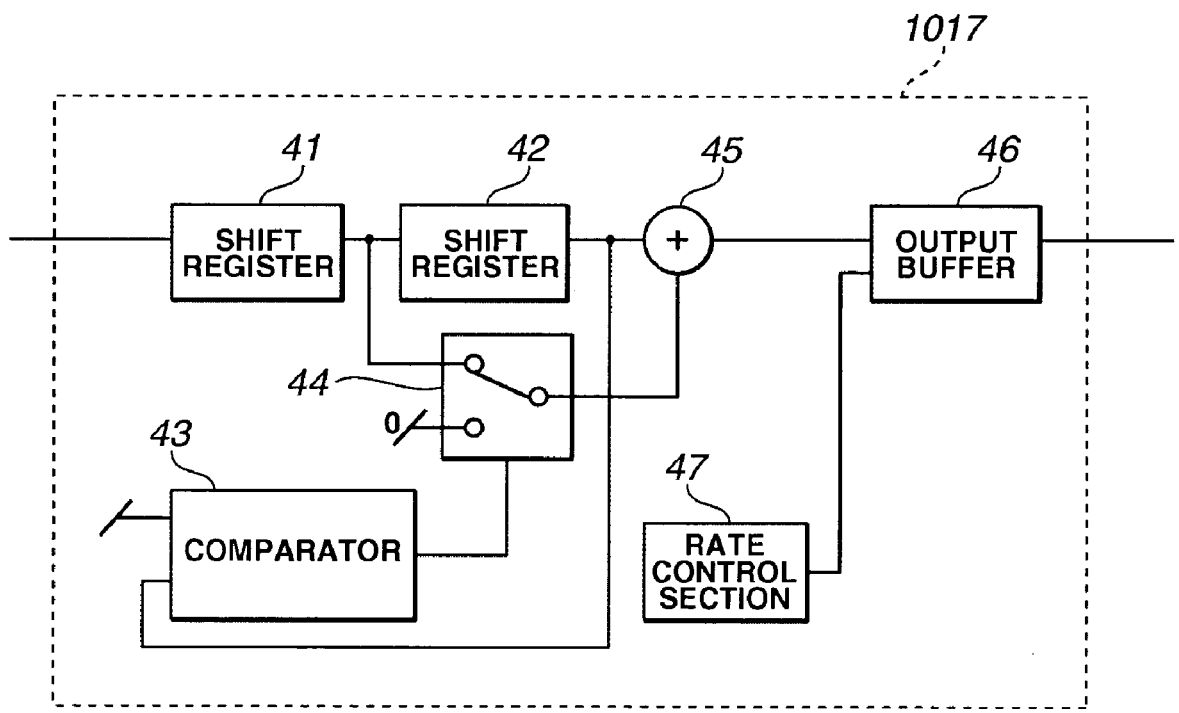
FIG. 5 is a circuit diagram showing an adder circuit.

FIG. 5 shows a detailed circuit arrangement of the adder circuit 1017.

The output of pixel section 9 (hereinafter, referred to as "pixel output") and the saturation output, produced from the sensor, are converted through the AD converter into digital data and input into the adder circuit 1017.

Shift registers 41 and 42 are sequentially connected to send the converted digital data to succeeding stages in synchronism with an output clock. A comparator 43 determines whether or not the pixel output is larger than a predetermined value. A selector 44 sends either the saturation output or "0" to an adder 45 based on an output of the comparator 43. The adder 45 adds the pixel output sent from the shift register 42 and the saturation output sent from the selector 44. An output buffer 46 sends the pixel output of the adder 45 to a succeeding image processing section. A rate control section 47 controls a rate so that the output buffer 46 can produce only the pixel output.

As described above, the adder circuit 1017 adds the saturation output and the pixel output only when the pixel output is larger than a predetermined value. The adder circuit 1017 outputs the result of addition. When the pixel output is not larger than the predetermined value, the adder circuit 1017 produces only the pixel output. When the added output and the pixel output constitute an image signal corresponding to one complete screen, the image signal is input into the signal processing circuit 1008. The signal processing circuit 1008 produces a processed image.

The above-described arrangement facilitates obtaining an image having a wider dynamic range compared with that of a conventional imaging apparatus.

Furthermore, according to at least one exemplary embodiment, a signal representing the saturated light quantity and a signal representing the pixel output travel the same vertical and horizontal output lines 8 and 16. The arrangement of at least one exemplary embodiment can be robust against external noises (e.g., offset of the amplifier 17). An improved image signal can be obtained.

Second Exemplary Embodiment

A second exemplary embodiment will be described with reference to the following drawings.

Figure 6:
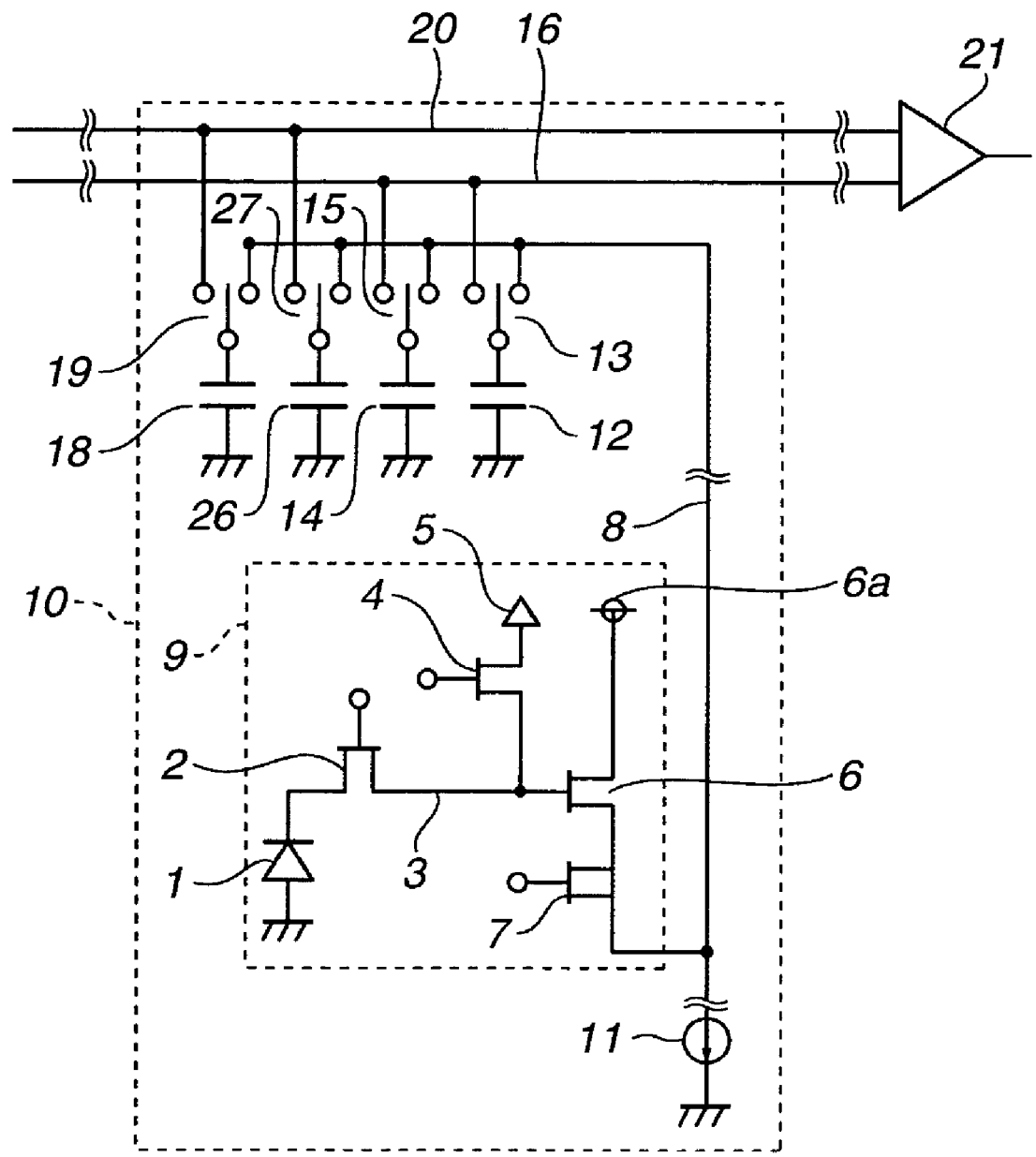
FIG. 6 is a circuit diagram showing an imaging element in accordance with a second exemplary embodiment.

FIG. 6 shows a circuit arrangement of a CMOS sensor functioning as an imaging element in accordance with the second exemplary embodiment.

A pixel section 9 of the second exemplary embodiment is identical in arrangement with that of the first exemplary embodiment and will not be described in the following.

Furthermore, a vertical output line 8, a constant-current source 11, capacitors 12 and 14 (i.e., memories), and changeover switches 13 and 15 of the second exemplary embodiment are identical in arrangement with those of the first exemplary embodiment and will not be described in the following.

A capacitor 26 is connected via a changeover switch 27 to the vertical output line 8. The capacitor 26 functions as a memory that temporarily stores a reset level voltage of FD 3 when the pixel output is produced. A capacitor 18 is connected via a changeover switch 19 to the vertical output line 8. The capacitor 18 functions as a memory that temporarily stores the reset level voltage of FD 3 when the saturation output is produced. The capacitors 26 and 18, respectively storing the reset level voltage, are connected via the changeover switches 27 and 19 to a horizontal output line 20 that outputs the reset level voltage. A differential amplifier 21 subtracts the output voltage (i.e., the reset level voltage) of the horizontal output line 20 from the output voltage of the horizontal output line 16, and produces a sensor output as a signal that does not include the reset level voltage.

Although FIG. 6 shows only one pixel section 9, an actual arrangement can include numerous pixel sections 9 disposed in a two-dimensional pattern as shown in FIG. 2. The members 12 to 19 are provided for each column.

As described with reference to FIG. 4, the imaging apparatus can include a CMOS sensor. The imaging apparatus is identical in arrangement with that of the first exemplary embodiment and will not be described.

Figure 7:
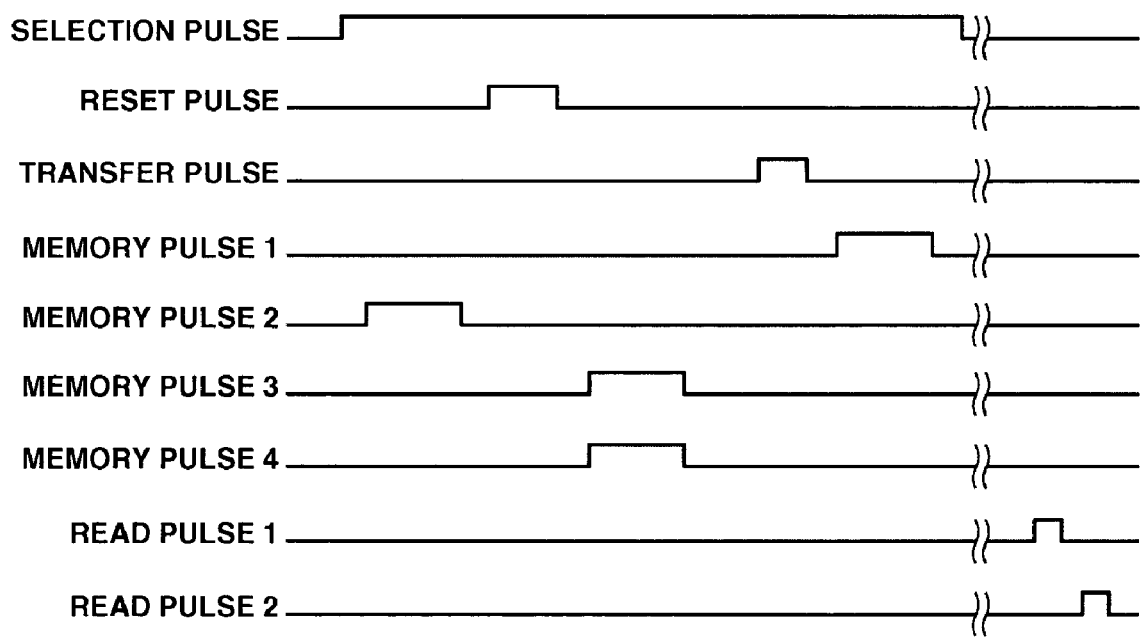
FIG. 7 is a timing chart showing a sensor driving operation in accordance with the second exemplary embodiment.

FIG. 7 shows timing pulses produced from TG that operates in the following manner. When a pixel section 9 is selected, the selection pulse becomes "High." The selection switch 7 is turned on.

In this condition, when PD 1 is in a saturated state, saturation charge flows into FD 3. FD 3 has electric charge corresponding to a saturated light quantity. FET 6 converts the electric charge into a voltage. A voltage corresponding to the saturated light quantity is output to the vertical output line 8. In this condition, the memory pulse 2 becomes "High." The changeover switch 15 shifts its movable contact to the vertical output line 8. The capacitor 14 temporarily stores a voltage corresponding to the saturated light quantity.

Then, the reset pulse becomes "High." The reset switch 4 becomes set to an ON state and FD 3 is reset to a predetermined voltage. Subsequently, memory pulses 3 and 4 become "High." The changeover switches 27 and 19 shift their movable contacts to the vertical output line 8. The capacitors 26 and 18 temporarily store the reset level voltage.

Then, the transfer pulse becomes "High." The transfer switch 2 is turned on. Electric charge of the pixel section 9 is passed (read out) from PD 1 to FD 3. In this condition, FD 3 holds the transferred electric charge of pixel section 9. Accordingly, FET 6 converts the electric charge into a voltage. A voltage corresponding to the electric charge of pixel section 9 is output to the vertical output line 8. In this condition, the memory pulse 1 becomes "High." The changeover switch 13 shifts its movable contact to the vertical output line 8. The capacitor 12 temporarily stores a voltage corresponding to the electric charge of pixel section 9.

Then, the read pulse 1 becomes "High." The changeover switches 13 and 27 shift their movable contacts to the horizontal output lines. The voltage corresponding to the electric charge of pixel section 9 temporarily stored in the capacitor 12 is output to the horizontal output line 16. The reset level voltage temporarily stored in the capacitor 26 is output to the horizontal output line 20. The differential amplifier 21 produces an output representing the pixel output that does not involve the reset level voltage.

Then, the read pulse 2 becomes "High." The changeover switches 15 and 19 shift their movable contacts to the horizontal output lines. The voltage corresponding to the saturated light quantity temporarily stored in the capacitor 14 is output to the horizontal output line 16. The reset level voltage temporarily stored in the capacitor 18 is output to the horizontal output line 20. The differential amplifier 21 produces an output representing the saturation output that does not involve the reset level voltage.

The above-described arrangement facilitates obtaining an image having a wider dynamic range compared with that of a conventional imaging apparatus. Furthermore, as the differential amplifier removes the reset noise of FD 3, an output signal having an improved S/N ratio can be obtained.

Furthermore, according to at least one exemplary embodiment, a signal representing the saturated light quantity and a signal representing the pixel output travel the same vertical and horizontal output lines. The arrangement of at least one exemplary embodiment can be robust against external noises (e.g., offset of the amplifier 17). An improved image signal can be obtained.

Third Exemplary Embodiment

A third exemplary embodiment will be described with reference to the following drawings.

Figure 8:
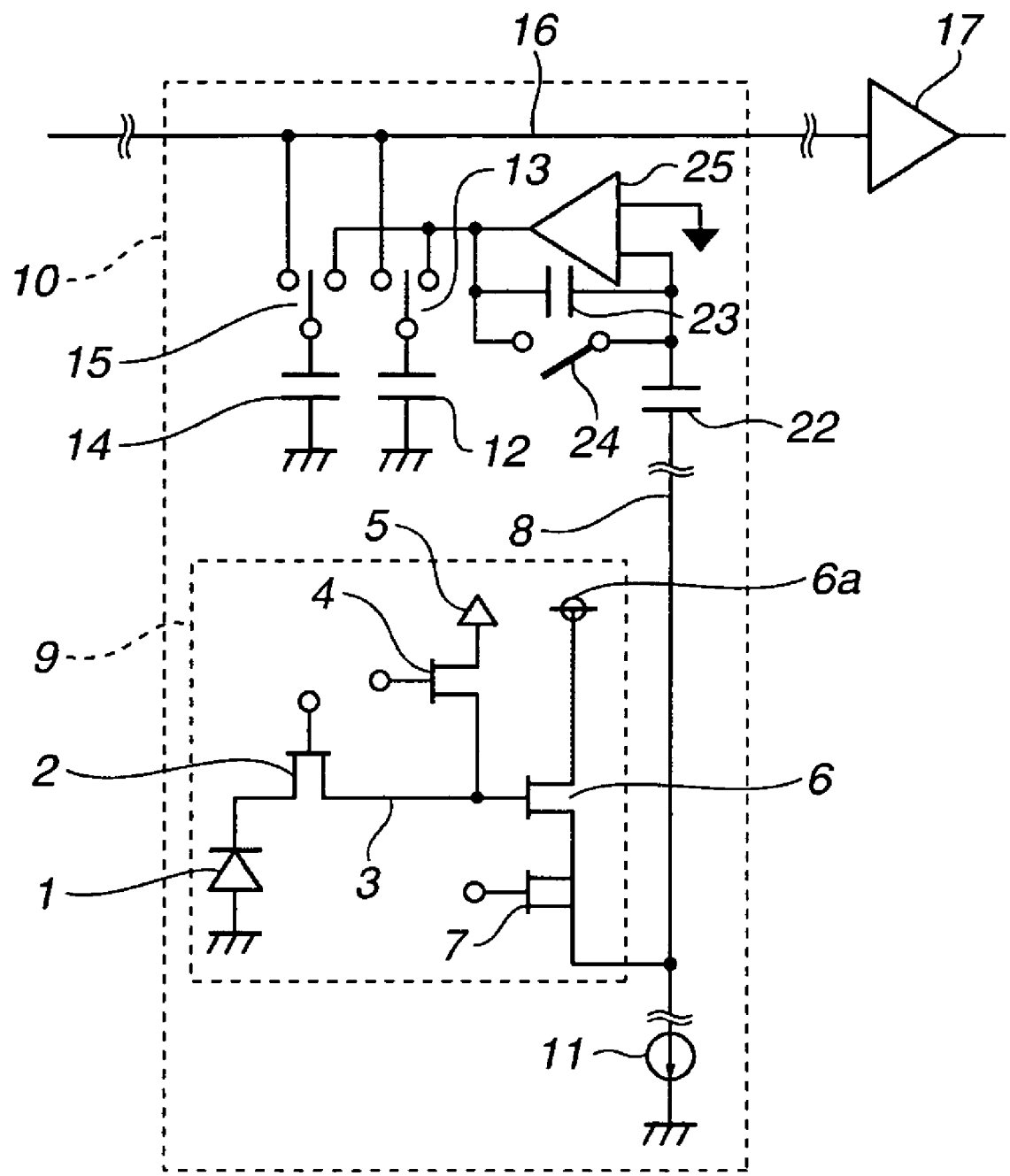
FIG. 8 is a circuit diagram showing an imaging element in accordance with a third exemplary embodiment, a sixth exemplary embodiment, and a seventh exemplary embodiment.

FIG. 8 shows a circuit arrangement of a CMOS sensor functioning as an imaging element in accordance with the third exemplary embodiment.

A pixel section 9 of the third exemplary embodiment is identical in arrangement with that of the first exemplary embodiment and will not be described in the following.

Furthermore, a constant-current source 11 of the third exemplary embodiment is identical in arrangement with that of the first exemplary embodiment and will not be described in the following.

A capacitor 22 is connected, at one end, to the vertical output line 8. The capacitor 22 temporarily stores the reset level voltage of FD 3. The other end of the capacitor 22 is connected to a positive input terminal of a differential amplifier 25. Furthermore, the other end of the capacitor 22 is connected to a switch 24 that is used for virtually grounding the differential amplifier 25, and is also connected to a capacitor 23 that temporarily stores a difference between the reset level voltage and a signal level voltage.

An output terminal of the differential amplifier 25 is connected via the changeover switch 13 to the capacitor 12 that functions as a memory temporarily storing the pixel output. Furthermore, the output terminal of the differential amplifier 25 is connected via the changeover switch 15 to the capacitor 14 that functions as a memory temporarily storing the saturation output. Furthermore, the capacitors 12 and 14 are connected via the changeover switches 13 and 15 to a single horizontal output line 16. The output amplifier 17 produces an output representing the voltage of the horizontal output line 16.

Although FIG. 8 shows only one pixel section 9, an actual arrangement can include numerous pixel sections 9 disposed in a two-dimensional pattern as shown in FIG. 2. The members 12-15 and 22-25 are provided for each column.

As described with reference to FIG. 4, the imaging apparatus can include a CMOS sensor. The arrangement of the imaging apparatus is identical with that of the first exemplary embodiment.

Figure 9:
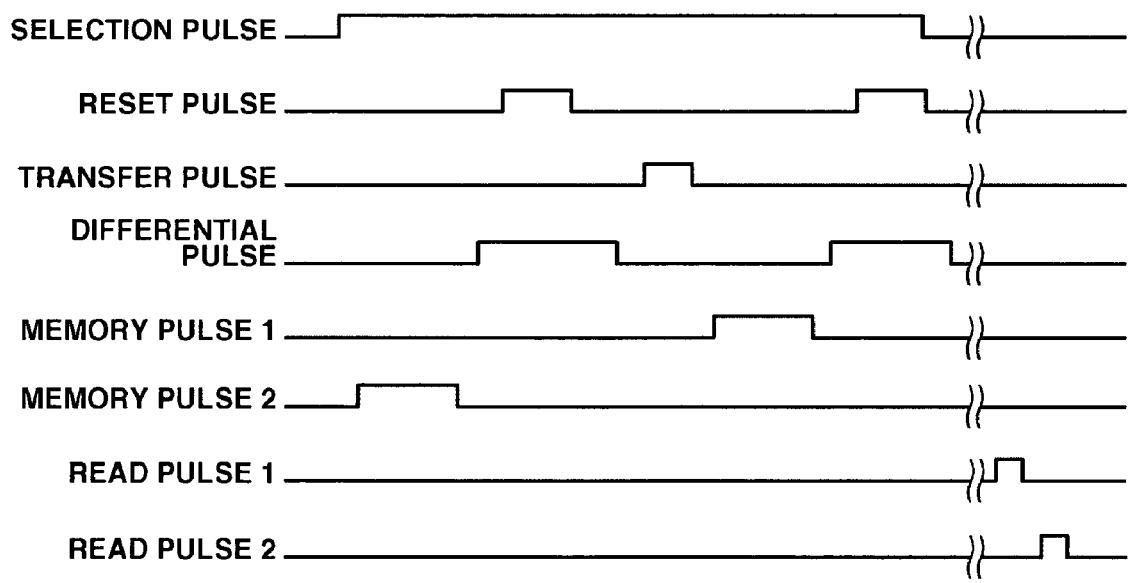
FIG. 9 is a timing chart showing a sensor driving operation in accordance with the third exemplary embodiment.

FIG. 9 shows timing pulses produced from TG that operates in the following manner. When a pixel section 9 is selected, the selection pulse becomes "High." The selection switch 7 is turned on.

In this condition, when PD 1 is in a saturated state, saturation charge flows into FD 3. FD 3 has electric charge corresponding to a saturated light quantity. FET 6 converts the electric charge into a voltage. A voltage corresponding to the saturated light quantity is output to the vertical output line 8. Furthermore, the capacitor 22 stores the reset voltage that was memorized in a previous reading operation.

As the differential pulse is "Low", the switch 24 is in an opened state. The capacitor 23 stores a difference between the previous reset voltage and the saturation output. The differential amplifier 25 produces an output representing the difference. In this condition, the memory pulse 2 becomes "High." The changeover switch 15 shifts its movable contact to the vertical output line 8. The capacitor 14 temporarily stores a voltage corresponding to the saturated light quantity.

Then, the reset pulse becomes "High." The reset switch 4 is turned on. The differential pulse becomes "High." The switch 24 is closed. FD 3 is reset to a predetermined voltage. At the same time, the capacitor 22 stores this voltage. Then, the differential pulse becomes "Low." The switch 24 is opened. The transfer pulse becomes "High." The transfer switch 2 is turned on. Electric charge of pixel section 9 is passed (read out) from PD 1 to FD 3.

In this condition, FD 3 holds the transferred electric charge of pixel section 9. Accordingly, FET 6 converts the electric charge into a voltage. A voltage corresponding to the electric charge of pixel section 9 is output to the vertical output line 8. The capacitor 23 stores a difference voltage between the previous reset level voltage and the voltage corresponding to the electric charge of pixel section 9. The differential amplifier 25 produces an output representing the difference voltage. In this condition, the memory pulse 1 becomes "High." The changeover switch 13 shifts its movable contact to the vertical output line 8. The capacitor 12 temporarily stores the voltage corresponding to the electric charge of pixel section 9.

Then, the reset pulse again becomes "High." The reset switch 4 is turned on. The differential pulse becomes "High." The switch 24 is closed. FD 3 is reset to a predetermined voltage. At the same time, the capacitor 22 stores this voltage. With this arrangement, the capacitor 22 can store a reset level voltage in the next reading operation.

Next, the read pulse 1 becomes "High." The changeover switch 13 shifts its movable contact to the horizontal output line 16. The voltage corresponding to the electric charge of pixel section 9, temporarily stored in the capacitor 12, is output to the horizontal output line 16. The output amplifier 17 produces an output representing the pixel output. Then, the read pulse 2 becomes "High." The changeover switch 15 shifts its movable contact to the horizontal output line 16. The voltage corresponding to the saturated light quantity, temporarily stored in the capacitor 14, is output to the horizontal output line 16. The output amplifier 17 produces an output representing the saturation output.

The above-described arrangement facilitates obtaining an image having a wider dynamic range compared with that of a conventional imaging apparatus. Furthermore, as the differential amplifier removes the reset noise of FD 3, an output signal having an improved S/N ratio can be obtained.

Furthermore, according to at least one exemplary embodiment, a signal representing the saturated light quantity and a signal representing the pixel output travel the same vertical and horizontal output lines. The arrangement of at least one exemplary embodiment can be robust against external noises (e.g., offset of the amplifier 17). An improved image signal can be obtained.

Fourth Exemplary Embodiment

A fourth exemplary embodiment will be described with reference to the following drawings.

A CMOS sensor functioning as an imaging element of the fourth exemplary embodiment is identical in arrangement with that shown in FIG. 17, and will not be described in the following.

Figure 17:
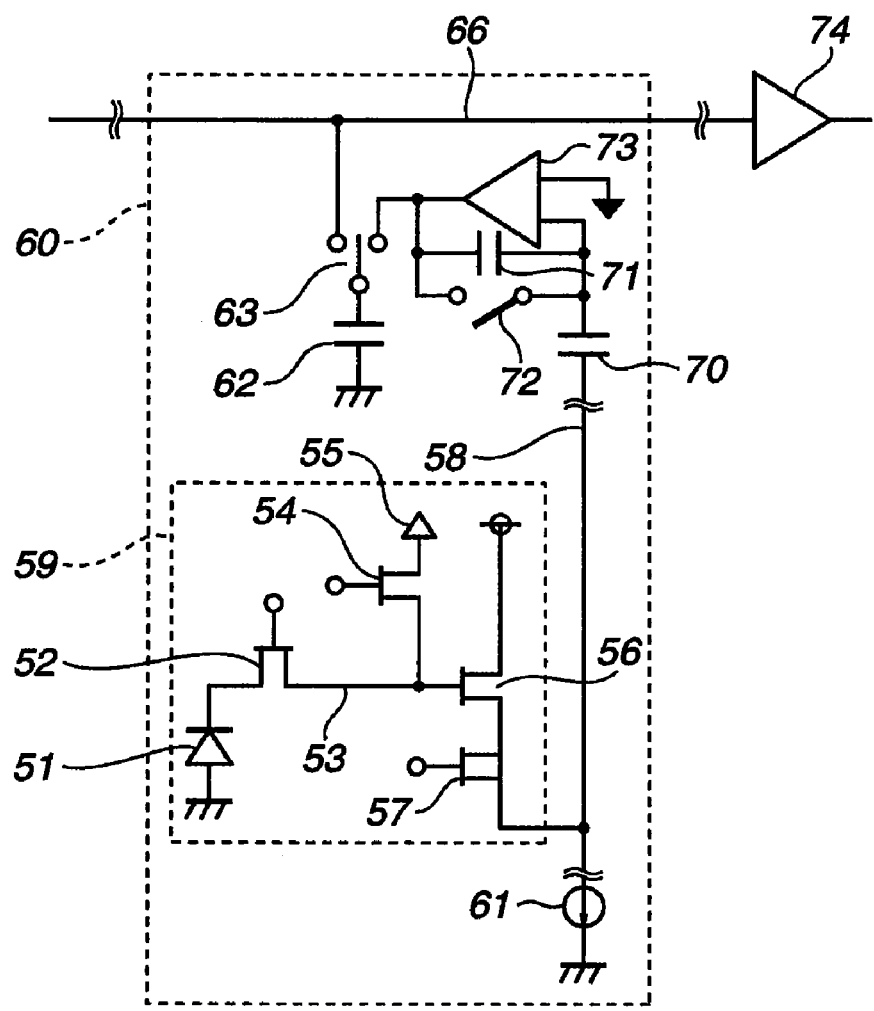
FIG. 17 is a circuit diagram showing a conventional CMOS sensor.
Figure 18:
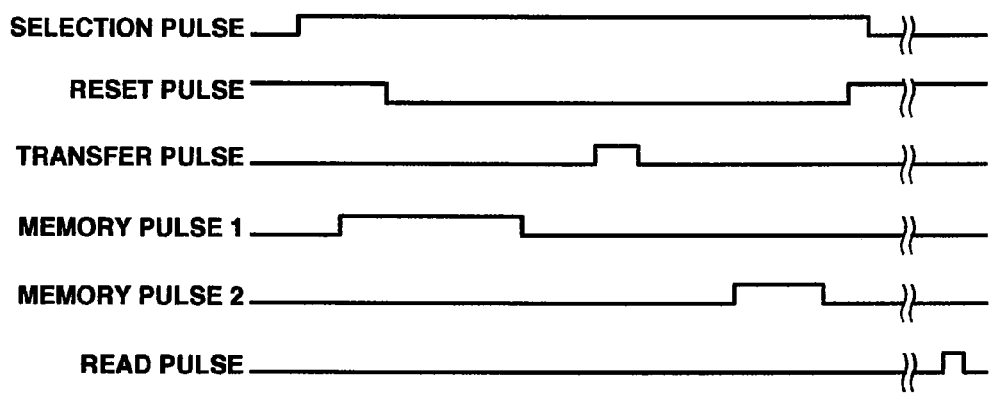
FIG. 18 is a timing chart showing a sensor driving operation of the conventional CMOS sensor.

Although FIG. 17 shows only one pixel section 59, an actual arrangement can include numerous pixel sections 59 disposed in a two-dimensional pattern as shown in FIG. 2. The members 62, 63, and 70-73 are provided for each column.

As described with reference to FIG. 4, the imaging apparatus can include a CMOS sensor. The arrangement of the imaging apparatus is identical with that of the first exemplary embodiment.

Figure 10:
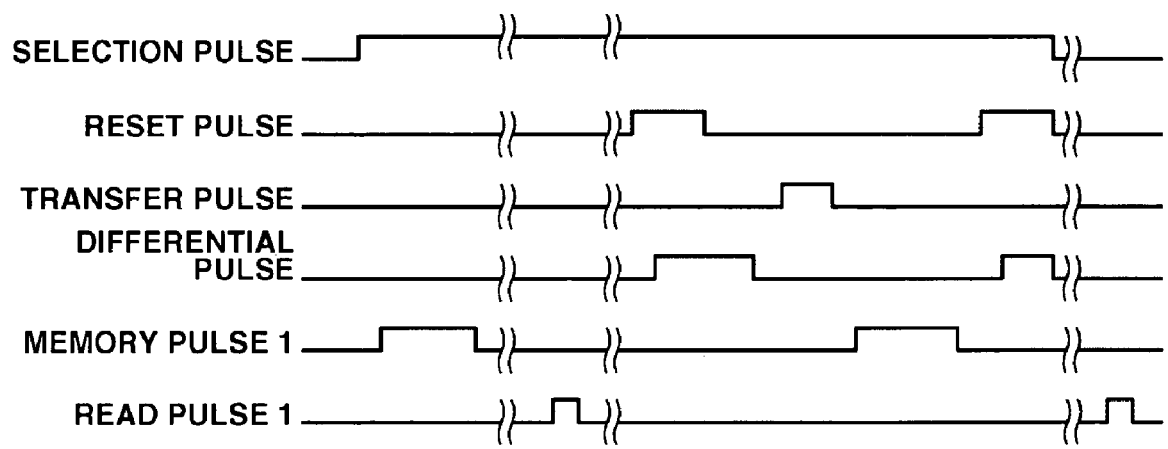
FIG. 10 is a timing chart showing a sensor driving operation in accordance with a fourth exemplary embodiment.

FIG. 10 shows timing pulses produced from TG that operates in the following manner with respect to the fourth exemplary embodiment. When a pixel section 59 is selected, the selection pulse becomes "High." The selection switch 57 is turned on.

In this condition, when PD 51 is in a saturated state, saturation charge flows into FD 53. FD 53 has electric charge corresponding to a saturated light quantity. FET 56 converts the electric charge into a voltage. A voltage corresponding to the saturated light quantity is output to the vertical output line 58. Furthermore, the capacitor 70 stores the reset voltage that was memorized in a previous reading operation.

As the differential pulse is "Low", the switch 72 is in an opened state. The capacitor 71 stores a difference between the previous reset voltage and the saturation output. The differential amplifier 73 produces an output representing the difference. In this condition, the memory pulse 1 becomes "High." The changeover switch 63 shifts its movable contact to the vertical output line 58. The capacitor 62 temporarily stores a voltage corresponding to the saturated light quantity.

Then, the read pulse 1 becomes "High." The changeover switch 63 shifts its movable contact to the horizontal output line 66. A voltage corresponding to the electric charge of pixel section 59, temporarily stored in the capacitor 62, is output to the horizontal output line 66. The output amplifier 74 produces an output representing the saturation output.

Then, the reset pulse becomes "High." The reset switch 54 is turned on. The differential pulse becomes "High." The switch 72 is closed. FD 53 is reset to a predetermined voltage. At the same time, the capacitor 70 stores this voltage. Then, the differential pulse becomes "Low." The switch 24 is opened. The transfer pulse becomes "High." The transfer switch 52 is turned on. Electric charge of pixel section 59 is passed (read out) from PD 51 to FD 53.

In this condition, as FD 53 holds the transferred electric charge of pixel section 59, FET 56 converts the electric charge into a voltage. A voltage corresponding to the electric charge of pixel section 59 is output to the vertical output line 58. The capacitor 71 stores a difference voltage between the previous reset level voltage and the voltage corresponding to the electric charge of pixel section 59. The differential amplifier 74 produces an output representing the difference voltage. In this condition, the memory pulse 1 becomes "High." The changeover switch 63 shifts its movable contact to the vertical output line 58. The capacitor 62 temporarily stores the voltage corresponding to the electric charge of pixel section 59.

Then, the reset pulse again becomes "High." The reset switch 54 is turned on. The differential pulse becomes "High." The switch 72 is closed. FD 53 is reset to a predetermined voltage. At the same time, the capacitor 70 stores this voltage. With this arrangement, the capacitor 70 can store a reset level voltage in the next reading operation.

Next, the read pulse 1 becomes "High." The changeover switch 63 shifts its movable contact to the horizontal output line 66. The voltage corresponding to the electric charge of pixel section 59, temporarily stored in the capacitor 62, is output to the horizontal output line 66. The output amplifier 74 produces an output representing the pixel output.

The above-described arrangement facilitates obtaining an image having a wider dynamic range compared with that of a conventional imaging apparatus. Furthermore, as the differential amplifier removes the reset noise of FD 53, an output signal having an improved S/N ratio can be obtained.

Furthermore, according to at least one exemplary embodiment, a signal representing the saturated light quantity and a signal representing the pixel output travel the same vertical and horizontal output lines. The arrangement of at least one exemplary embodiment can be robust against external noises (e.g., offset of the amplifier 17). An improved image signal can be obtained.

Fifth Exemplary Embodiment

A fifth exemplary embodiment will be described with reference to the following drawings.

A CMOS sensor functioning as an imaging element of the fifth exemplary embodiment is identical in arrangement with that shown in FIG. 17, and will not be described in the following.

Although FIG. 17 shows only one pixel section 59, an actual arrangement can include numerous pixel sections 59 disposed in a two-dimensional pattern as shown in FIG. 2. The members 62, 63, and 70-73 are provided for each column.

As described with reference to FIG. 4, the imaging apparatus can include a CMOS sensor. The arrangement of the imaging apparatus is identical with that of the first exemplary embodiment.

Figure 11:
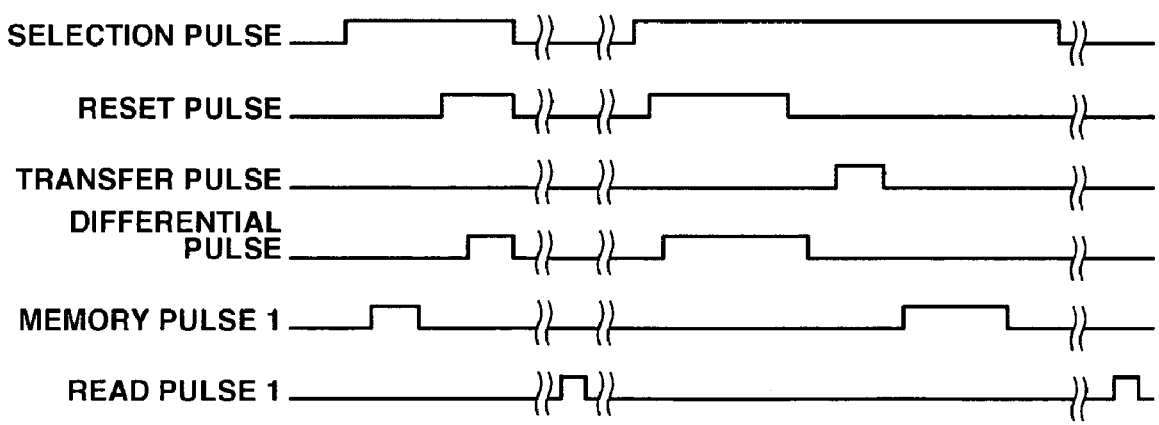
FIG. 11 is a timing chart showing a sensor driving operation in accordance with a fifth exemplary embodiment.

FIG. 11 shows timing pulses produced from TG that operates in the following manner. When a pixel section 59 is selected, the selection pulse becomes "High." The selection switch 57 is turned on.

In this condition, when PD 51 is in a saturated state, saturation charge flows into FD 53. FD 53 has electric charge corresponding to a saturated light quantity. FET 56 converts the electric charge into a voltage. A voltage corresponding to the saturated light quantity is output to the vertical output line 58. Furthermore, the capacitor 70 stores the reset voltage that was memorized in a previous reading operation.

As the differential pulse is "Low", the switch 72 is in an opened state. The capacitor 71 stores a difference between the previous reset voltage and the saturation output. The differential amplifier 73 produces an output representing the difference. In this condition, the memory pulse 1 becomes "High." The changeover switch 63 shifts its movable contact to the vertical output line 58. The capacitor 62 temporarily stores a voltage corresponding to the saturated light quantity.

Then, the reset pulse becomes "High." The reset switch 54 is turned on. The differential pulse becomes "High." The switch 72 is closed. FD 53 is reset to a predetermined voltage. At the same time, the capacitor 70 stores this voltage. With this arrangement, the capacitor 70 can store a reset level voltage in the next reading operation.

Then, the selection pulse becomes "Low." The read pulse 1 becomes "High." The changeover switch 63 shifts its movable contact to the horizontal output line 66. A voltage corresponding to the electric charge of pixel section 59, temporarily stored in the capacitor 62, is output to the horizontal output line 66. The output amplifier 74 produces an output representing the saturation output. The above-described operation is performed for all of the pixel sections 59. The saturation output corresponding to one complete screen is produced.

Then, the selection pulse again becomes "High." The reset pulse becomes "High." The reset switch 54 is turned on. The differential pulse becomes "High." The switch 72 is closed. FD 53 is reset to a predetermined voltage. At the same time, the capacitor 70 stores this voltage. Then, the differential pulse becomes "Low." The switch 72 is opened. The transfer pulse becomes "High." The transfer switch 52 is turned on. Electric charge of pixel section 59 is passed (read out) from PD 51 to FD 53. In this case, as FD 53 holds the transferred electric charge of pixel section 59, FET 56 converts the electric charge into a voltage. A voltage corresponding to the electric charge of pixel section 59 is output to the vertical output line 58.

The capacitor 71 stores a difference voltage between the previous reset level voltage and the voltage corresponding to the electric charge of pixel section 59. The differential amplifier 74 produces an output representing the voltage. In this condition, the memory pulse 1 becomes "High." The changeover switch 63 shifts its movable contact to the vertical output line 58. The capacitor 62 temporarily stores the voltage corresponding to the electric charge of pixel section 59.

Then, the read pulse 1 becomes "High." The changeover switch 63 shifts its movable contact to the horizontal output line 66. The voltage corresponding to the electric charge of pixel section 59, temporarily stored in the capacitor 62, is output to the horizontal output line 66. The output amplifier 74 produces an output representing the pixel output. The above-described operation is performed for all of the pixel sections 59. The pixel output corresponding to a screen is produced.

Both the saturation output and the pixel output are sent to the image processing section, and are temporarily stored in a memory (not shown) in the image processing section. Only when the pixel output is larger than a predetermined value, the pixel output and the saturation output are added. Thus, an image output having a wider dynamic range can be obtained.

The above-described arrangement facilitates obtaining an image having a wider dynamic range compared with that of a conventional imaging apparatus. Furthermore, as the differential amplifier removes the reset noise of FD 3, an output signal having an improved S/N ratio can be obtained.

Furthermore, according to at least one exemplary embodiment, a signal representing the saturated light quantity and a signal representing the pixel output travel the same vertical and horizontal output lines. The arrangement of at least one exemplary embodiment can be robust against external noises (e.g., offset of the amplifier 17). An improved image signal can be obtained.

Sixth Exemplary Embodiment

A sixth exemplary embodiment will be described with reference to the following drawings.

An imaging element of the sixth exemplary embodiment is the CMOS sensor having the arrangement shown in FIG. 8.

The arrangement of the sensor is identical with that of the third exemplary embodiment.

The arrangement of the imaging apparatus using the CMOS sensor is shown in FIG. 4, and is accordingly identical with that of the first exemplary embodiment.

Figure 12:
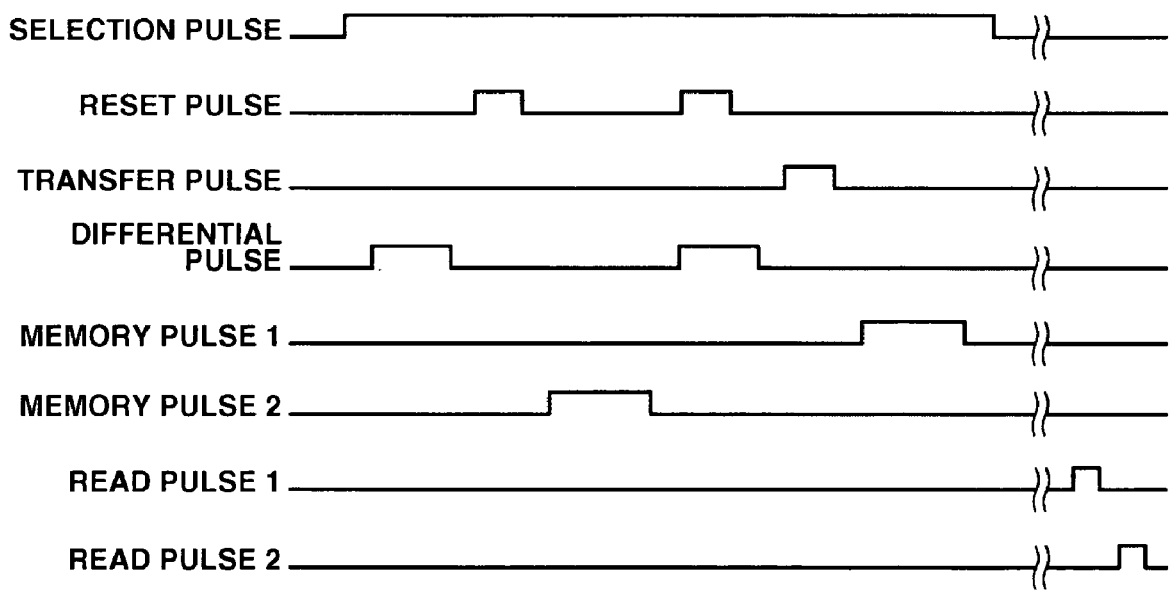
FIG. 12 is a timing chart showing a sensor driving operation in accordance with the sixth exemplary embodiment.

FIG. 12 shows timing pulses produced from TG that operates in the following manner. When a pixel section 9 is selected, the selection pulse becomes "High." The selection switch 7 is turned on.

In this condition, when PD 1 is in a saturated state, saturation charge flows into FD 3. FD 3 has electric charge corresponding to a saturated light quantity. FET 6 converts the electric charge into a voltage. A voltage corresponding to the saturated light quantity is output to the vertical output line 8. In this condition, the differential pulse becomes "High." The switch 24 is closed. The capacitor 22 stores a saturation output voltage. Next, the differential pulse becomes "Low." Then, the reset pulse becomes "High." FD 3 is connected to a predetermined voltage terminal. The reset level voltage is output to the vertical output line 8.

In this case, the differential pulse is "Low" and accordingly the switch 24 is in an opened state. The capacitor 23 stores a difference voltage between the reset voltage and the saturation output. The differential amplifier 25 produces an output representing the difference voltage. In this case, the sixth exemplary embodiment is different from the third exemplary embodiment in that the polarity of the saturation output is opposite. In this condition, the memory pulse 2 becomes "High." The changeover switch 15 shifts its movable contact to the vertical output line 8. The capacitor 14 temporarily stores a voltage corresponding to the saturated light quantity.

Then, in the condition where the reset level voltage is output to the vertical output line 8, the differential pulse again becomes "High." The switch 24 is closed. The capacitor 22 stores a reset level voltage. Then, the differential pulse becomes "Low." The switch 24 is opened. The transfer pulse becomes "High." The transfer switch 2 is turned on. Electric charge of pixel section 9 is passed (read out) from PD 1 to FD 3. In this condition, FD 3 holds the transferred electric charge of pixel section 9. Accordingly, FET 6 converts the electric charge into a voltage. The voltage corresponding to the electric charge of pixel section 9 is output to the vertical output line 8.

The capacitor 23 stores a difference voltage between the previous reset level voltage and the voltage corresponding to the electric charge of pixel section 9. The differential amplifier 25 produces an output representing the difference voltage. In this condition, the memory pulse 1 becomes "High." The changeover switch 13 shifts its movable contact to the vertical output line 8. The capacitor 12 temporarily stores the voltage corresponding to the electric charge of pixel section 9.

Then, the read pulse 1 becomes "High." The changeover switch 13 shifts its movable contact to the horizontal output line 16. The voltage corresponding to the electric charge of pixel section 9, temporarily stored in the capacitor 12, is output to the horizontal output line 16. The output amplifier 17 produces an output representing the pixel output. Then, the read pulse 2 becomes "High." The changeover switch 15 shifts its movable contact to the horizontal output line 16. The voltage corresponding to the saturated light quantity, temporarily stored in the capacitor 14, is output to the horizontal output line 16. The output amplifier 17 produces an output representing the saturation output.

The above-described arrangement facilitates obtaining an image having a wider dynamic range compared with that of a conventional imaging apparatus. Furthermore, as the differential amplifier removes the reset noise of FD 3, an output signal having an improved S/N ratio can be obtained. Furthermore, the reset level voltage of pixel section 9 is used to obtain the saturation output. Therefore, the S/N ratio can be further improved.

Furthermore, according to at least one exemplary embodiment, a signal representing the saturated light quantity and a signal representing the pixel output travel the same vertical and horizontal output lines. The arrangement of at least one exemplary embodiment can be robust against external noises (e.g., offset of the amplifier 17). An improved image signal can be obtained.

Seventh Exemplary Embodiment

A seventh exemplary embodiment will be described with reference to the following drawings.

An imaging element of the seventh exemplary embodiment is the CMOS sensor having the arrangement shown in FIG. 8.

The arrangement of the sensor is identical with that of the third exemplary embodiment.

The arrangement of the imaging apparatus using the CMOS sensor is shown in FIG. 4, and is accordingly identical with that of the first exemplary embodiment.

Figure 13:
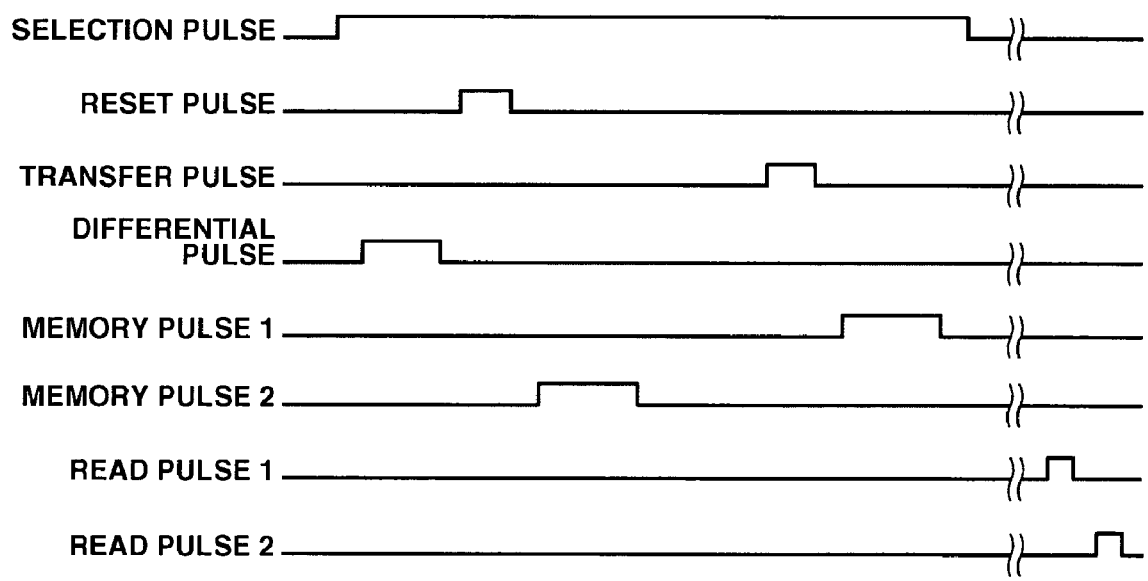
FIG. 13 is a timing chart showing a sensor driving operation in accordance with the seventh exemplary embodiment.

FIG. 13 shows timing pulses produced from TG that operates in the following manner. When a pixel section 9 is selected, the selection pulse becomes "High." The selection switch 7 is turned on.

In this condition, when PD 1 is in a saturated state, saturation charge flows into FD 3. FD 3 has electric charge corresponding to a saturated light quantity. FET 6 converts the electric charge into a voltage. A voltage corresponding to the saturated light quantity is output to the vertical output line 8. In this condition, the differential pulse becomes "High." The switch 24 is closed. The capacitor 22 stores a saturation output voltage. Next, the differential pulse becomes "Low." Then, the reset pulse becomes "High." FD 3 is connected to a predetermined voltage terminal. The reset level voltage is output to the vertical output line 8.

In this case, the differential pulse is "Low" and accordingly the switch 24 is in an opened state. The capacitor 23 stores a difference voltage between the reset voltage and the saturation output. The differential amplifier 25 produces an output representing the difference voltage. In this case, the seventh exemplary embodiment is different from the third exemplary embodiment in that the polarity of the saturation output is opposite. In this condition, the memory pulse 2 becomes "High." The changeover switch 15 shifts its movable contact to the vertical output line 8. The capacitor 14 temporarily stores a voltage corresponding to the saturated light quantity.

Then, the transfer pulse becomes "High." The transfer switch 2 is turned on. Electric charge of pixel section 9 is passed (read out) from PD 1 to FD 3. In this condition, FD 3 holds the transferred electric charge of pixel section 9. Accordingly, FET 6 converts the electric charge into a voltage. The voltage corresponding to the electric charge of pixel section 9 is output to the vertical output line 8.

The capacitor 23 stores a difference voltage between the previous saturation level voltage and the voltage corresponding to the electric charge of pixel section 9. The differential amplifier 25 produces an output representing the difference voltage. In this condition, the memory pulse 1 becomes "High." The changeover switch 13 shifts its movable contact to the vertical output line 8. The capacitor 12 temporarily stores the voltage corresponding to the electric charge of pixel section 9.

Then, the read pulse 1 becomes "High." The changeover switch 13 shifts its movable contact to the horizontal output line 16. The voltage corresponding to the electric charge of pixel section 9, temporarily stored in the capacitor 12, is output to the horizontal output line 16. The output amplifier 17 produces an output representing the pixel output. Then, the read pulse 2 becomes "High." The changeover switch 15 shifts its movable contact to the horizontal output line 16. The voltage corresponding to the saturated light quantity, temporarily stored in the capacitor 14, is output to the horizontal output line 16. The output amplifier 17 produces an output representing the saturation output.

The above-described arrangement facilitates obtaining an image having a wider dynamic range compared with that of a conventional imaging apparatus. Furthermore, as the differential amplifier removes the reset noise of FD 3, an output signal having an improved S/N ratio can be obtained. Furthermore, the reset level voltage of pixel section 9 is used to obtain the saturation output. Therefore, the S/N ratio can be further improved. Furthermore, compared with the sixth exemplary embodiment, generation of the differential pulse for each pixel section 9 is only once. Therefore, the time required for a reading operation can be shortened. In other words, a speedy reading operation can be facilitated.

Furthermore, according to at least one exemplary embodiment, a signal representing the saturated light quantity and a signal representing the pixel output travel the same vertical and horizontal output lines. The arrangement of at least one exemplary embodiment can be robust against external noises (e.g., offset of the amplifier 17). An improved image signal can be obtained.

Eighth Embodiment

An eighth embodiment will be described with reference to the following drawings.

Figure 19:
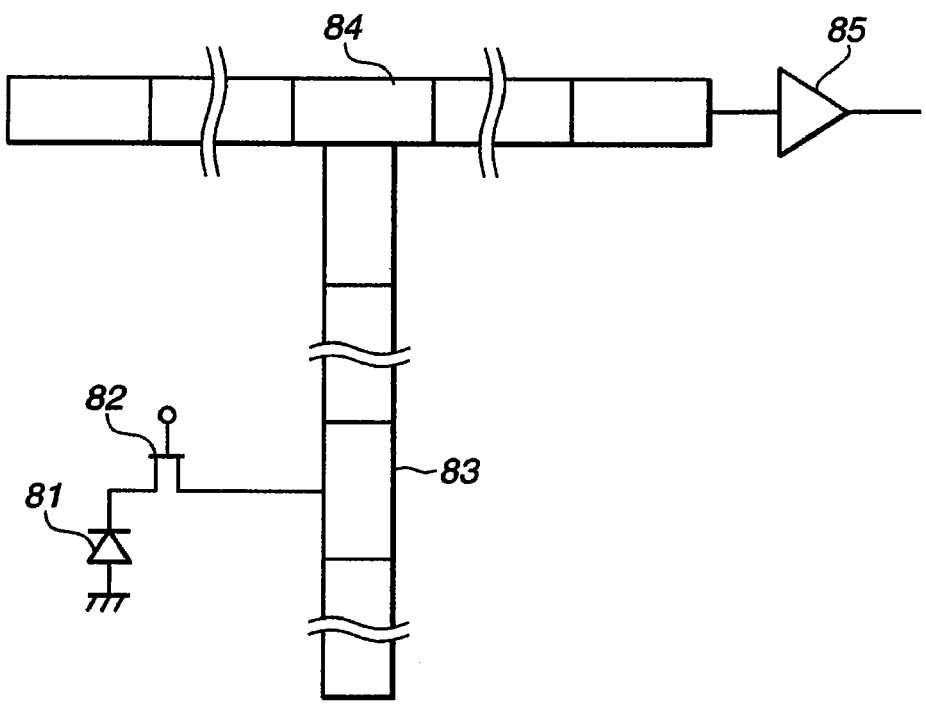
FIG. 19 is a diagram showing a conventional CCD sensor.
Figure 20:
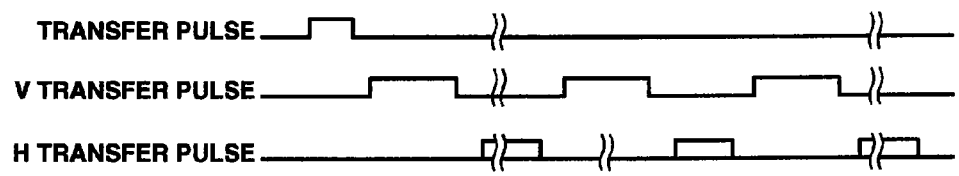
FIG. 20 is a timing chart showing a sensor driving operation of the conventional CCD sensor.
Figure 21:
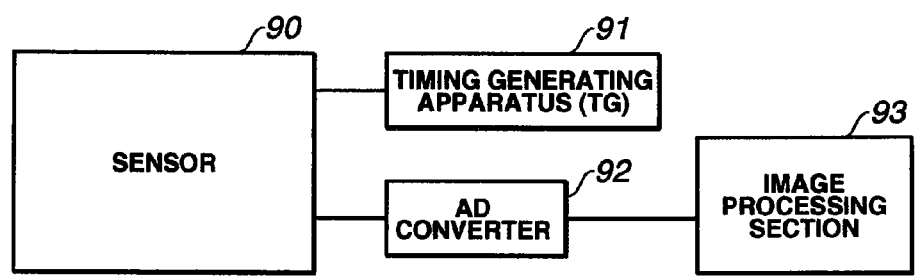
FIG. 21 is a block diagram showing a conventional imaging apparatus.

A CCD functioning as an imaging element of the eighth embodiment is identical in arrangement with that shown in FIG. 19, and will not be described in the following.

However, according to the CCD of at least one exemplary embodiment, saturation charge flows into a vertical transfer CCD via the transfer switch 82. Thus, the saturation charge does not flow into the overflow drain when PD 81 is saturated.

The imaging apparatus including the CCD is identical in arrangement with a conventional apparatus.

Figure 14:
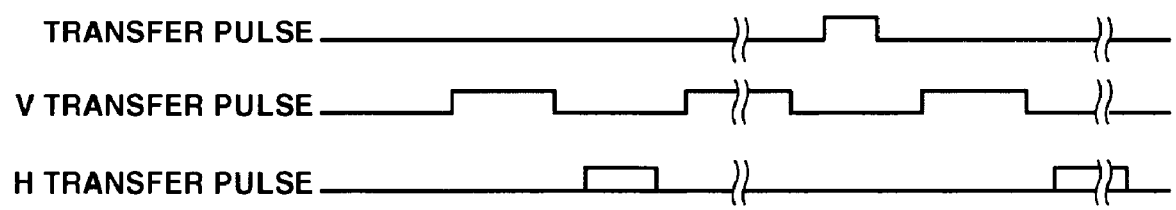
FIG. 14 is a timing chart showing a sensor driving operation in accordance with an eighth exemplary embodiment.
Figure 15:
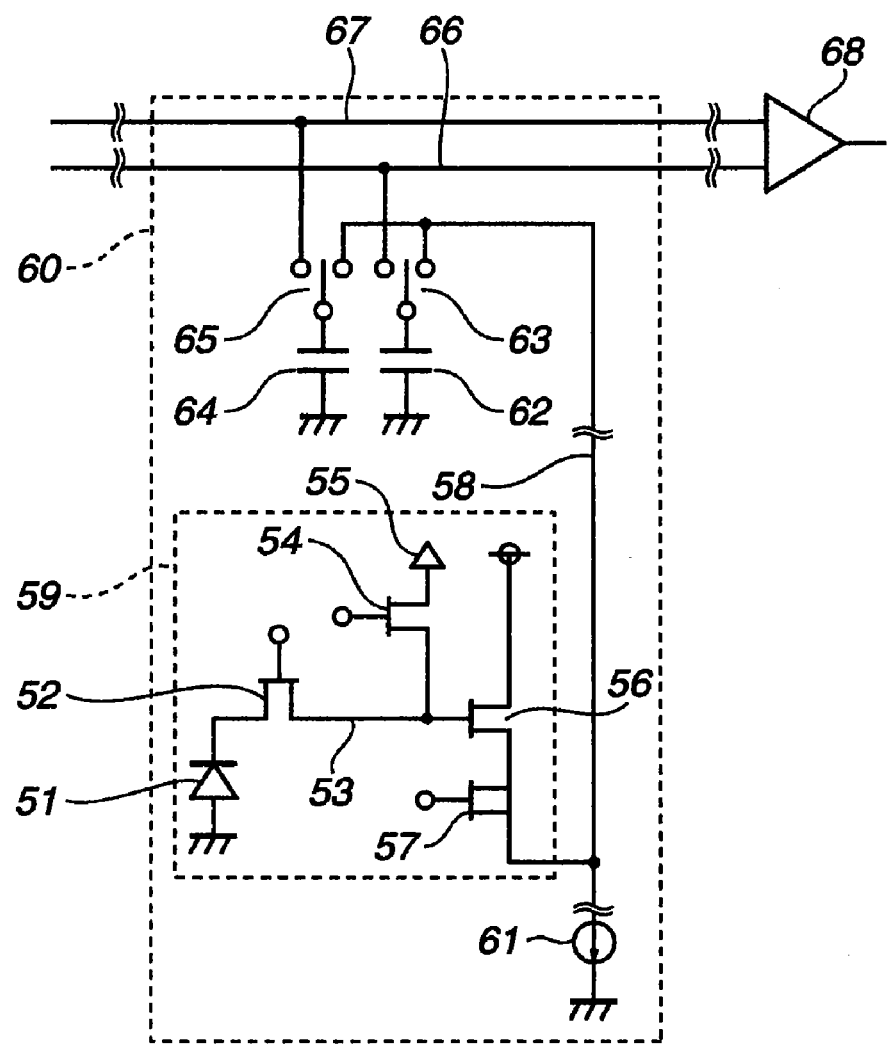
FIG. 15 is a circuit diagram showing a conventional CMOS sensor.
Figure 16:
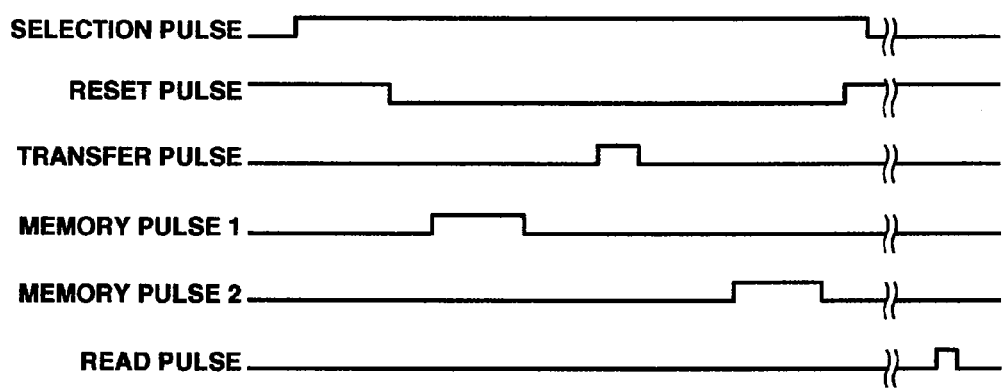
FIG. 16 is a timing chart showing a sensor driving operation of the conventional CMOS sensor.

FIG. 14 shows timing pulses produced from TG that operates in the following manner.

When PD 81 is in a saturation state, saturation charge flows into the vertical transfer CCD. Before the transfer pulse is generated, both the V transfer pulse and the H transfer pulse are generated to perform a transfer of one complete screen. The transferred data are temporarily stored as the saturation output. Then, the transfer pulse becomes "High." Photoelectron of PD 81 is transferred to the vertical transfer CCD. Both the V transfer pulse and the H transfer pulse are generated to perform a transfer of one complete screen. The transferred data are temporarily stored as the pixel output.

Only when the temporarily stored pixel output exceeds a predetermined value, the pixel output and the saturation output are added to form the image data.

The above-described arrangement facilitates obtaining an image having a wider dynamic range compared with that of a conventional imaging apparatus.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2005-034586 filed Feb. 10, 2005, which is hereby incorporated by reference herein in its entirety.

What is claimed is:

1. An imaging apparatus comprising:
   a plurality of pixel sections disposed in a two-dimensional pattern, each pixel section including a photoelectric conversion member, a semiconductor region holding a signal transferred from the photoelectric conversion member, a transfer switch transferring the signal of the photoelectric conversion member to the semiconductor region, and a reading member reading a signal of the semiconductor region;

a plurality of vertical output lines, each vertical output line provided for a plurality of pixel sections disposed in a vertical direction for successively outputting signals of the pixel sections;

at least one horizontal output line successively outputting signals of the plurality of vertical output lines;

a driving circuit configured to drive the reading member in a pixel section to successively read a saturation signal leaked from the photoelectric conversion member in the pixel section to the semiconductor region, during a charging period of photoelectric charge in the photoelectric conversion member in the pixel section, and a photoelectric conversion signal generated from the photoelectric conversion member in the pixel section, in which both the saturation signal and the photoelectric conversion signal of the pixel section are read out via the same path of the vertical output line and the horizontal output line; and a signal processing circuit configured to form a pixel of an image based on the saturation signal and the photoelectric conversion signal from the pixel section.

2. The imaging apparatus according to claim 1, wherein the driving circuit drives the reading member to read a reset signal obtained after the semiconductor region is reset, and the driving circuit comprises a differential processing circuit configured as a common circuit to successively execute differential processing between the reset signal and the saturation signal and differential processing between the reset signal and the photoelectric conversion signal.

3. An imaging apparatus comprising:

a plurality of pixel sections disposed in a two-dimensional pattern, each including a photoelectric conversion member, a semiconductor region holding a signal transferred from the photoelectric conversion member, a transfer switch transferring the signal of the photoelectric conversion member to the semiconductor region, and a reading member reading the signal of the semiconductor region;

a driving circuit configured to drive the reading member of a pixel section to successively read a saturation signal leaked from the photoelectric conversion member of the pixel section to the semiconductor region, during a charging period of photoelectric charge in the photoelectric conversion member in the pixel section, and a photoelectric conversion signal generated from the photoelectric conversion member in the pixel section;

a correction circuit configured to reduce errors in the saturation signal; and a signal processing circuit configured to form a pixel of an image based on the error reduced saturation signal and the photoelectric conversion signals from the pixel section.

4. The imaging apparatus according to claim 3, wherein the correction circuit reduces errors in the photoelectric conversion signal, and where the signal processing circuit forms the image based on the error reduced saturation signal and the error reduced photoelectric conversion signal.

5. An imaging apparatus comprising:

a plurality of pixel sections disposed in a two-dimensional pattern, each pixel section including a photoelectric conversion member, a semiconductor region holding a signal transferred from the photoelectric conversion member, a transfer switch transferring the signal of the photoelectric conversion member to the semiconductor region, and a reading member reading a signal of the semiconductor region;

a driving circuit configured to drive the reading member of a pixel section to read a first reset signal obtained after the semiconductor region of the pixel section of a first line is reset, then drive the reading member to read a saturation signal generated in the pixel section of a second line, then drive the reading member to read a second reset signal obtained after the semiconductor region of the pixel section of the second line is reset, and then drive the reading member to read a photoelectric conversion signal generated from the pixel section of the second line;

a differential processing circuit configured to execute differential processing between the first reset signal and the saturation signal, and differential processing between the second reset signal and the photoelectric conversion signal from the pixel section; and a signal processing circuit configured to form a pixel of an image based the saturation signal and the photoelectric conversion signal from the pixel section that are both subjected to the differential processing, wherein the saturation signal is a signal leaked from the photoelectric conversion member of the pixel section to the semiconductor region during a charging period of photoelectric charge in the photoelectric conversion member of the pixel section.

6. The imaging apparatus according to claim 4, further comprising:

a plurality of vertical output lines, each vertical output line provided for a plurality of pixel sections disposed in a vertical direction for successively outputting signals of the pixel sections; and at least one horizontal output line successively outputting signals of the plurality of vertical output lines, wherein the differential processing circuit is a clamp circuit, and the clamp circuit is provided for each vertical output line.

7. An imaging apparatus comprising:

a plurality of pixel sections disposed in a two-dimensional pattern, each pixel section including a photoelectric conversion member, a semiconductor region holding a signal transferred from the photoelectric conversion member, a transfer switch transferring the signal of the photoelectric conversion member to the semiconductor region, and a reading member reading a signal of the semiconductor region;

a driving circuit configured to drive the reading member, in each of the pixel sections disposed in the two-dimensional pattern, to successively read a plurality of saturation signals associated with a plurality of pixel sections, where each saturation signal is leaked from the photoelectric conversion member of an associated pixel section to the semiconductor region of the associated pixel section, during a charging period of photoelectric charge in the photoelectric conversion member of the associated pixel section, and where the driving circuit then drives the reading members of the associated pixel sections to successively read a plurality of photoelectric conversion signals generated from the photoelectric conversion members of the associated pixel sections; and a signal processing circuit configured to form an image based on the saturation signals and the photoelectric conversion signals from the associated pixel sections.

* * * * *